United States Patent [19]

Imano et al.

[11] Patent Number: 4,744,850

[45] Date of Patent: May 17, 1988

[54] METHOD FOR BONDING AN LSI CHIP ON A WIRING BASE

[75] Inventors: Yoshitugu Imano; Kazuhito Ozawa, both of Nara; Yoshitomo Kitanishi, Kashihara; Katsuhide Shino, Nara; Yukihiro Inoue, Kashihara; Yoshinori Oogita, Nara; Kazuhiro Nakao, Nara; Shigeki Komaki, Nara, all of Japan

[73] Assignee: Sharp Kabushiki Kaisha, Osaka, Japan

[21] Appl. No.: 805,420

[22] Filed: Dec. 9, 1985

Related U.S. Application Data

[63] Continuation of Ser. No. 593,651, Mar. 26, 1984, abandoned.

[30] Foreign Application Priority Data

Apr. 21, 1983 [JP] Japan ................... 58-71020

[51] Int. Cl.$^4$ .................. B29C 65/02; B29C 65/30; B29C 65/48; B29C 65/54
[52] U.S. Cl. .................................. 156/265; 156/256; 156/273.9; 156/275.5; 156/275.7; 156/297; 156/311; 174/117 A; 361/409; 361/411
[58] Field of Search ............. 174/88 R, 94 R, 117 A, 174/117 F, 117 FF, 72 B; 156/272.2, 273.9, 275.5, 275.7, 379.7, 242, 245, 250, 256, 264, 265, 297, 299, 311, 196; 361/409, 411; 264/272.17, 25, 27, 219, 248, 259

[56] References Cited

U.S. PATENT DOCUMENTS

| | | | |
|---|---|---|---|
| 3,981,070 | 9/1976 | Buelow | 29/574 |
| 4,113,981 | 9/1978 | Fujita et al. | 174/88 R |
| 4,126,292 | 11/1978 | Saeki et al. | 425/572 |
| 4,157,932 | 6/1979 | Hirata | 156/334 |
| 4,460,804 | 7/1984 | Suejkousky | 174/117 A |

OTHER PUBLICATIONS

Emerson & Cuming, Inc., ECCOBOND ® Adhesives, 8-1-68, pp. 2-4.

Primary Examiner—Merrell C. Cashion, Jr.
Attorney, Agent, or Firm—Birch, Stewart, Kolasch & Birch

[57] ABSTRACT

A method for bonding a LSI chip having terminals on a wiring base having electrodes which comprises the steps of coating a heat sensitive adhesive on the surface of a wafer forming a plurality of LSI chips, sprinkling electrically conductive particles thereon, dopping the electrically conductive particles, scribing the wafer to be divided into each of the LSI chips, positioning each of the terminals of the LSI chip and each of the electrodes of the wiring base face to face, and bonding the LSI chip on the wiring base.

4 Claims, 3 Drawing Sheets

METHOD FOR BONDING AN LSI CHIP ON A WIRING BASE

This application is a continuation of application Ser. No. 593,651 filed on Mar. 26, 1984, now abandoned.

BACKGROUND OF THE INVENTION

The present invention relates to a LSI (Large Scale Integrated Circuit) chip bonding method, and more particularly, to a method for bonding an LSI chip on a wiring base by using a heat sensitive adhesive having mixed therein electrically conductive particles.

FIG. 1 shows a sectional view of a LSI chip bonded on a base by using a conventional flip chip bonding method.

An LSI chip 1 is provided with Al (Aluminum) pads 2 as terminals of the LSI chip 1, and barrier metals 3 are formed on the positions corresponding to the Al pads 2. A base 6 is provided with wirings 5 having terminals. To connect the LSI chip 1 to the base 6, the Al pads 2 of the LSI chip 1 are bonded to the terminals of the wirings 5 on the base 6 through Au (Aurum) bumps 4.

In another flip chip bonding method, the LSI chip is bonded on the wiring base by using soldering bumps.

However, in the conventional soldering bump bonding method of the LSI chip, the LSI chip can not be bonded on a base impossible to solder, and also, a solderable wiring base must be heated to high temperature of about 250 degrees C. In the conventional Au bump bonding method, the terminals of the wirings on the base must be plated by Sn (Stannum) and the base must be heated at temperature of about 400 degrees C. Accordingly, the LSI chip may be destroyed by the high temperature.

Further, a bonding assembly using an electrically conductive adhesive is disclosed in U.S. Pat. No. 4,113,981, issued on Sept. 12, 1978, by Fujita et al., entitled "ELECTRICALLY CONDUCTIVE ADHESIVE CONNECTING ARRAYS OF CONDUCTORS". However, in U.S. Pat. No. 4,113,981, connecting terminals are additionally connected to terminals of the LSI chip and each of the LSI chips is seperately molded, and the molded LSI chip is bonded on the base. Therefore, this bonding assembly may not be suitable for mass production and compactness.

SUMMARY OF THE INVENTION

In view of the disadvantages of the conventional methods, it is an object of the present invention to provide a method for bonding an LSI chip on a wiring base by using a heat sensitive adhesive having electrically conductive particles mixed therein.

It is another object of the present invention to provide a method for bonding an LSI chip in which a wiring material and a base material can be freely selected.

It is still another object of the present invention to provide a method for bonding an LSI chip on a base which can not be influenced by heat.

It is a further object of the present invention to provide a method for bonding a LSI chip suitable to a base impossible to be soldered with a high density packaging.

It is still a further object of the present invention to provide a method for suitablly bonding an LSI chip on a glass base of a liquid crystal display device.

It is still further object of the present invention to provide a method for bonding an LSI chip on transparent electrodes on a glass base.

Other objects and further scope of applicability of the present invention will become apparent from the detailed description given hereinafter. It should be understood, however, that the detailed description of and specific examples, while indicating preferred embodiments of the invention, are given by way of illustration only, since various changes and modifications within the spirit and scope of the invention will become apparent to those skilled in the art from this detailed description.

According to an embodiment of the present invention, a method for bonding a LSI chip with terminals on a wiring base having electrodes comprises the steps of coating a heat sensitive adhesive on the surface of a wafer forming a plurality of LSI chips, sprinkling electrically conductive particles on the adhesive mixing the electrically conductive particles, scribing the wafer to be divided into each of the LSI chips, positioning each of the terminals of the LSI chip and each of the electrodes of the wiring base to face each other, and bonding the LSI chip on the wiring base.

In the above embodiment, the heat sensitive adhesive is selected from a heat melting material, a heat shielding material, and a delayed tack material as a principal agent, and the electrically conductive particle is selected from Ag, Au, Cu, and/or Ni.

According to another embodiment of the present invention, a method for bonding an LSI chip having terminals on a wiring base having electrodes comprises the steps of providing a heat sensitive film comprising a heat sensitive adhesive having electrically conductive particles mixed therein, adhering the heat sensitive film on the wiring base, positioning each of the terminals of the LSI chip and each of the electrodes of the wiring base face to each other, and bonding the LSI chip and the wiring base.

BRIEF DESCRIPTION OF THE DRAWINGS

The present invention will be better understood from the detailed description given hereinbelow and the accompanying drawings which are given by way of illustration only, and thus are not limitative of the present invention and wherein.

DETAILED DESCRIPTION OF THE INVENTION

Figure 1:
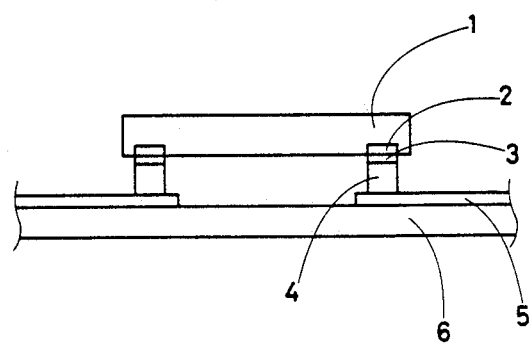
FIG. 1 shows a sectional view of an LSI chip bonded on a base by using a conventional flip chip bonding method.
Figure 2:
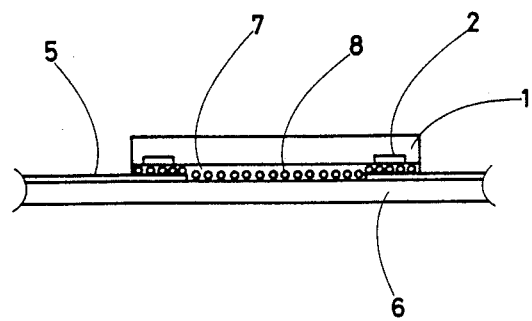
FIG. 2 shows a sectional view of an LSI chip bonded on a wiring base by using an LSI chip bonding according to an embodiment of the present invention.

Referring to FIG. 2, there is illustrated a sectional view of an LSI chip bonded on a wiring base by using an LSI chip bonding method according to an embodiment of the present invention.

The LSI chip 1 is provided with Al pads 2 as terminals of the LSI chip 1. The wiring base 6 is provided with wirings 5 having electrodes thereon. Because the Al pads 2 of the LSI chip 1 must be electrically connected to the electrodes of the wirings 5, a heat sensitive adhesive 7 such as a heat shielding type adhesive having electrically conductive particles mixed such as Ag powders therein is disposed between the LSI chip 1 and the wiring base 6.

The electrical connection between the Al pads of the LSI chip and the electrodes of the wirings 5 is achieved through the electrically conductive particles disposed between the Al pads of the LSI chip 1 and the electrodes of the wirings 5. The electrically conductive particles are not in contact with one another.

The heat sensitive adhesive 7 may be a heat melting material made of polyethylene resin etc., a heat shielding material made of a thermoplastic resin etc., and a delayed tack material made of a polyamide resin etc. and the like as a principal agent. The heat sensitive adhesive is electrically insulative.

The bonding method according to the embodiment of the present invention will be described to obtain the LSI of FIG. 2 as follows, as shown in FIGS. 3(a)–3(f).

Figure 3A:
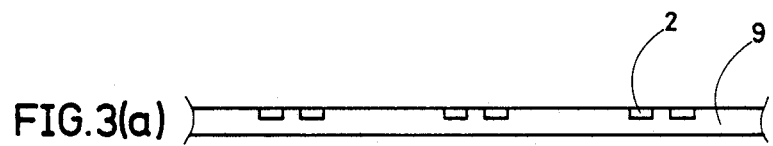
FIGS. 3(a) to 3(f) show views of explaining the LSI chip bonding method according to the present invention.

FIG. 3(a): A wafer 9 comprises a plurality of the LSI chips 1 each having pads 2 as terminals of the LSI chip 1.

Figure 3B:
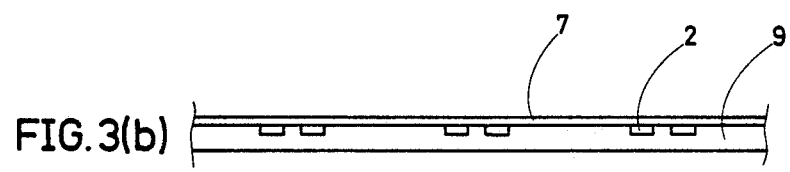

FIG. 3(b): The heat sensitive adhesive 7 is coated on the surface of the wafer 9.

Figure 3C:
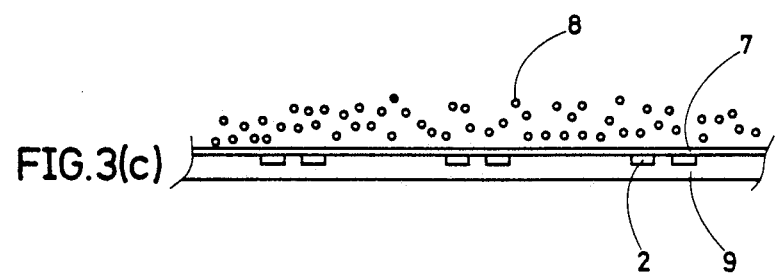

FIG. 3(c): The electrically conductive particles 8, such as Ag powder are uniformly sprinkled on the surface of a heat sensitive adhesive 7.

Figure 3D:
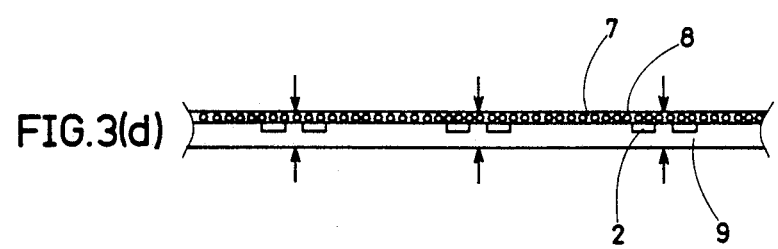

FIG. 3(d): After that, the electrically conductive particles 8 such as Ag powders, are mixed in the heat sensitive adhesive 7 by heating at the temperature of about 150 degrees C.

The thickness of the heat sensitive adhesive 7 is nearly equal to the diameter of each of the electrically conductive particles. For example, the thickness of the heat sensitive adhesive 7 is about 25 $\mu$m, and each of the electrically conductive particles 8, for example, Ag particles, is 25 $\mu$m in diameter. The sprinkled density if about 300 particles/mm$^2$.

After mixing, the wafer 9 is scribed at the positions as indicated by the arrows to be divided into each of the LSI chips 1.

Figure 3E:
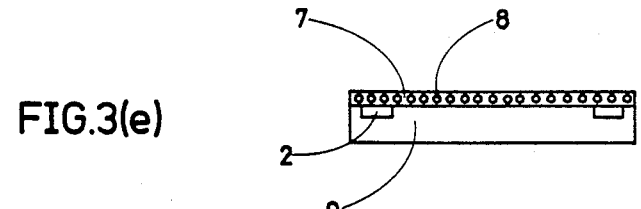

FIG. 3(e): A LSI chip 1 with the heat sensitive adhesive having the electrically conductive particles mixed therein is obtained.

Figure 3F:
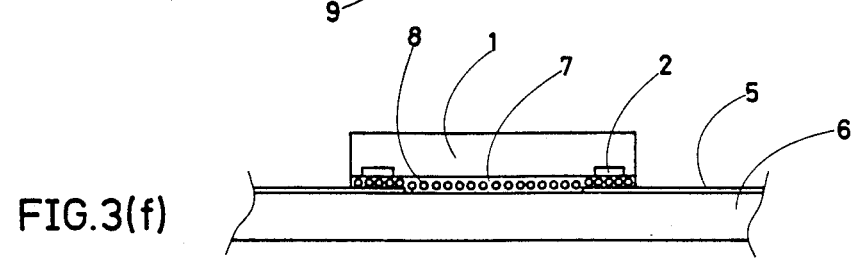

FIG. 3(f): The LSI chip 1 is bonded on the wiring base 6 so that each of the electrodes of the wiring 5 is connected to each of the terminals of the LSI chip 1. The LSI chip 1 is bonded by supplying a pressure of 20 Kgr/cm$^2$ for about 5 seconds by a heating iron at a temperature of 150 degrees C.

Figure 4A:
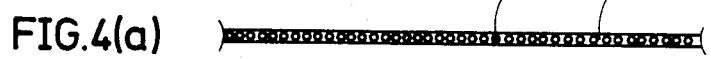
FIGS. 4(a) to 4(c) show views of explaining a LSI chip bonding method according to another embodiment of the present invention.
Figure 4B:
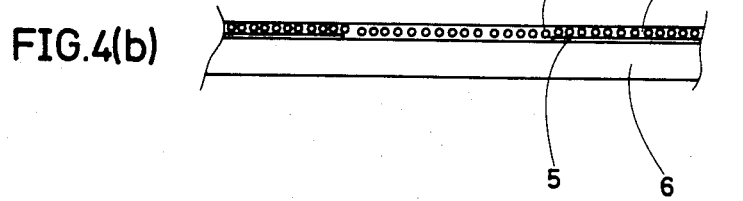

FIGS. 4(a) and 4(b) show an LSI chip bonding method according to another embodiment of the present invention.

Figure 4C:
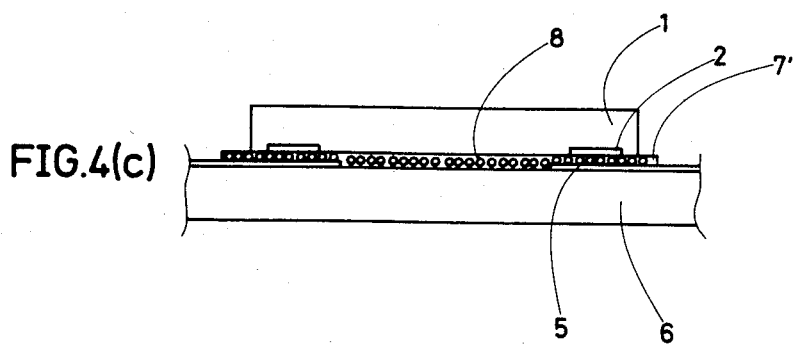

In FIG. 4(a) a heat sensitive film 7' comprising a heat sensitive adhesive having electrically conductive particles such as Ag powder mixed therein is contactly adhered to the wiring base 6 (FIG. 4(c) as shown in FIG. 4(b), and further, the LSI chip 1 is pressed to adhere to the heat sensitive film 7' of the wiring base 6. To adhere the heat sensitive film 7' on the wiring base 6, the wiring base 6 is heated at the temperature of about 150 degrees C., and the heat sensitive film 7' placed on the wiring base 6 is pressed and made to adhere by a roller.

According to the above embodiments, the heat sensitive adhesive and resulting film having the electrically conductive particles such as Ag powder mixed therein, respectively, are electrically conductive in the vertical direction, and electrically insulated in horizontal direction. Thus, the adhesive and film show an electrically conductive anisotorpic characteristic.

In the case where the LSI chip is bonded on the wiring base, the LSI chip and the wiring base are bonded to each other by heating and pressing after each of the pads of the LSI chip and each of the electrodes of the wirings on the base are positioned together.

As the heat sensitive adhesive and film are translucent, the positioning between the pads of the terminals of the LSI chip and the electrodes of the wirings on the base is achieved optically.

For example, the delayed tack resin of the heat sensitive adhesive may be composed of a thermoplastic resin such as polyester resin or neoprene rubber as a principal agent mixed with a thermosetting resin such as epoxy resin or phenol resin.

The electrically conductive particles may be made of Au, C, and Ni the like.

An insulating particle may be disposed between each electrically conductive particle if desired.

The bonding method of the present invention is suitable to a base impossible to solder with high density packaging, and can suitably bond an LSI chip on a glass base such as a liquid crystal display device, and also, can bond the LSI chip on the transparent electrodes of the glass base.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A method for preparing and optically bonding an LSI chip having terminals thereon to corresponding electrodes on the surface of a wiring base comprising the steps of:

uniformly coating a translucent electrically insulative adhesive on the surface of a wafer comprising a plurality of LSI chips each having conductive terminals thereon;

dispersing electrically conductive particles of substantially uniform diameter in said insulative adhesive such that said particles are not in contact with each other, said insulative adhesive having a thickness substantially equal to said diameter of said particles;

heating said insulative adhesive inclusive of said electrically conductive particles;

scribing said wafer such that it is divided into singular LSI chips;

providing a wiring base having electrodes thereon, and optically positioning said terminals of each of said LSI chips on corresponding electrodes of said wiring base by manually placing said LSI chip on said wiring base in a facing relationship such that each of said terminals of said respective LSI chip is positioned opposite corresponding electrodes of said wiring base, said positioning being achieved optically or visually as a result of said translucent heat sensitive adhesive; and bonding said LSI chip to said wiring base by applying heat to said LSI chip under pressure.

2. The method of claim 1, wherein said insulative adhesive is selected from a heat melt resin, a heat shielding resin, and a delayed tack resin.

3. The method of claim 1, wherein said electrically conductive particles are selected from Ag, Au, Cu, and/or Ni.

4. The method of claim 1, wherein insulating particles are disposed between each of said electrically conductive particles.

* * * * *